United States Patent [19]

Ishihara et al.

[11] Patent Number: 4,814,643

[45] Date of Patent: Mar. 21, 1989

[54] COMPARISON CIRCUIT

[75] Inventors: Ichiro Ishihara, Takaidohiga; Masahide Aoyama, Yokohama, both of Japan

[73] Assignee: Kabushiki Kaisha Toshiba, Kawasaki, Japan

[21] Appl. No.: 73,181

[22] Filed: Jul. 14, 1987

[30] Foreign Application Priority Data

Sep. 26, 1986 [JP] Japan ................................ 61-227283

[51] Int. Cl.$^4$ ............................................. H03K 5/24
[52] U.S. Cl. ..................... 307/355; 307/315; 307/491; 307/494
[58] Field of Search ............... 307/355, 356, 350, 362, 307/315, 491, 494; 330/252

[56] References Cited

U.S. PATENT DOCUMENTS 4,404,478  9/1983  Rischmüller ........................ 307/315
4,418,290  11/1983  Nagano ............................... 307/355

Primary Examiner—John Zazworsky
Attorney, Agent, or Firm—Finnegan, Henderson, Farabow, Garrett, & Dunner

[57] ABSTRACT

A comparison circuit includes a differential amplifier having first and second input circuits each of which is formed of darlington-connected transistors and which are connected to receive first and second input signals. The comparison circuit further includes an operation mode control circuit for selectively short-circuiting the base-emitter path of each of the first stage bipolar transistors in the first and second input circuits, in response to the first and second input signals.

11 Claims, 4 Drawing Sheets

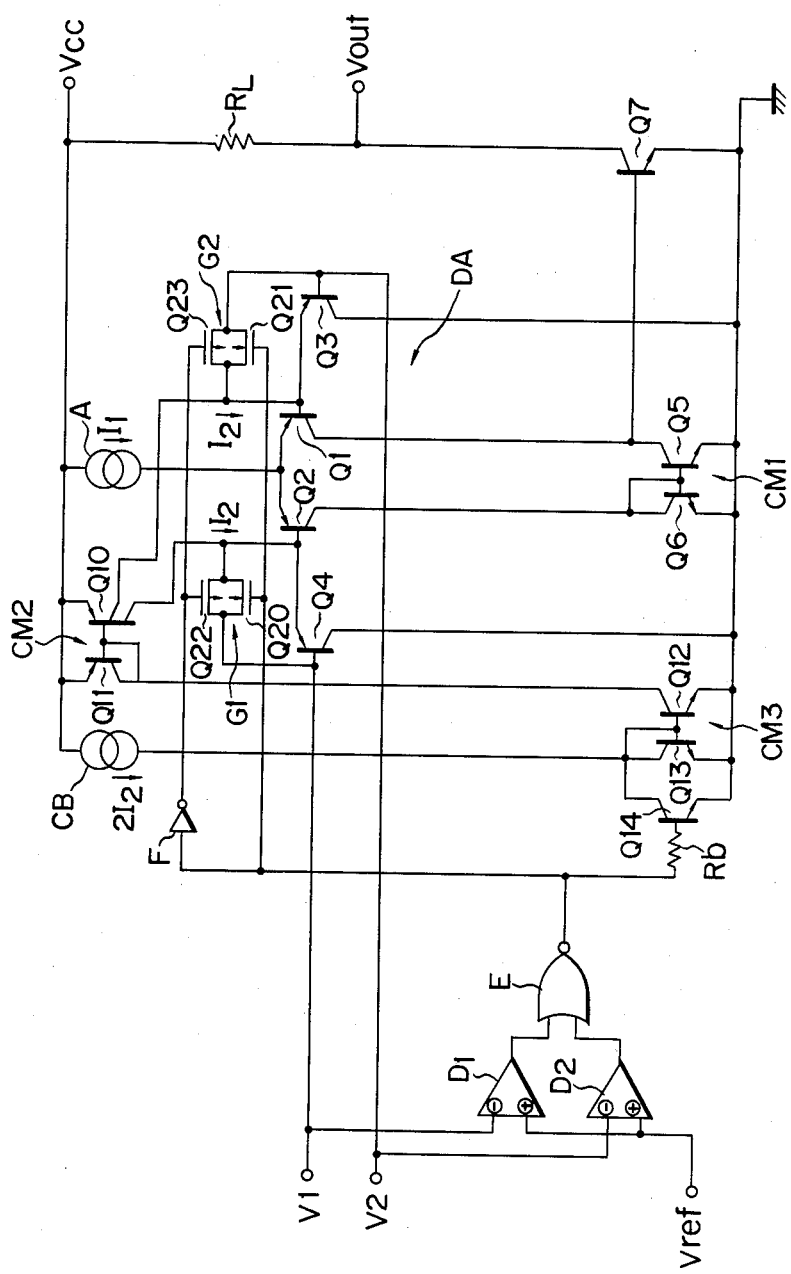
F I G. 2

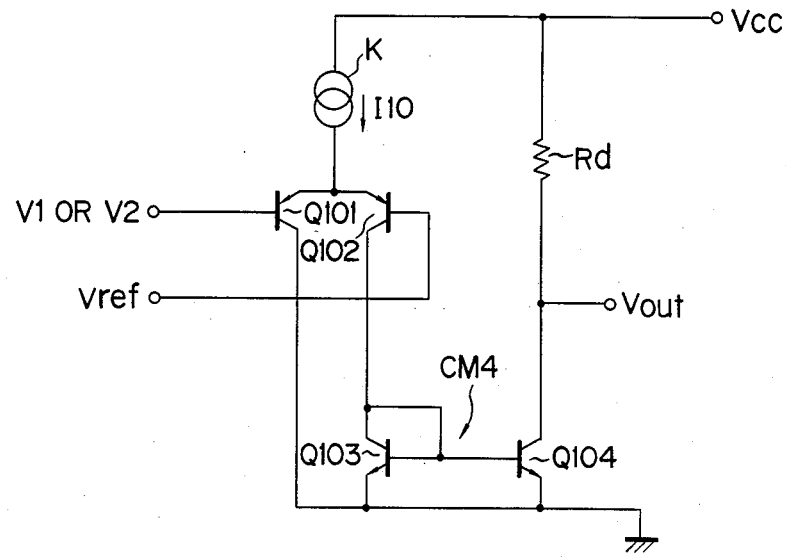
F I G. 3
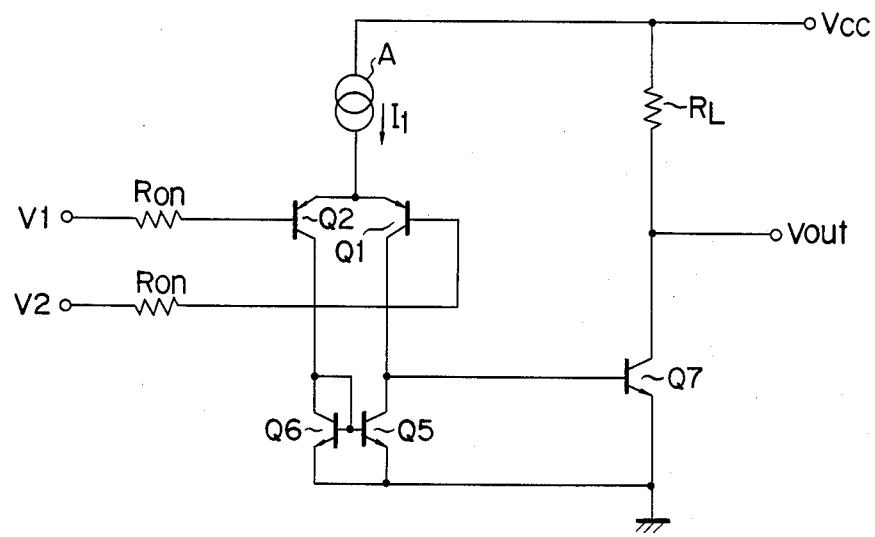
F I G. 4

COMPARISON CIRCUIT

BACKGROUND OF THE INVENTION

The present invention relates to a comparison circuit which includes a differential amplifier comprising darlington-connected bipolar transistors.

A comparison circuit including a differential amplifier comprised of darlington-connected bipolar transistors, as shown in FIG. 1, is known. This differential amplifying circuit includes differential amplifier DA which is comprised of darlington-connected pnp transistors Q01 and Q03, and darlington-connected pnp transistors Q02 and Q04.

Constant-current source A for supplying current I1 is connected to the emitters of transistors Q01 and Q02. Constant-current sources B and C are respectively connected to the emitters of transistors Q03 and Q04, and supply identical current I2, so as to minimize the offset voltage of the comparator.

First and second input signals V1 and V2 are respectively supplied to the bases of transistors Q04 and Q03. The collectors of npn transistors Q05 and Q06 constituting current mirror circuit CMA are respectively connected to the collectors of transistors Q01 and Q02. The base of transistor Q07 is connected to the collector of transistor Q05. The collector of transistor Q07 is connected to power source terminal Vcc via load resistor RL, and its emitter is grounded.

This comparison circuit compares first and second input signals V1 and V2 with each other. When the value of input signal V1 is higher than that of input signal V2, transistor Q03 is rendered more conductive than transistor Q04, and hence transistor Q01 is turned on and transistor Q02 is turned off.

Since no current flows through transistor Q06, current mirror circuit CMA constituted by transistors Q05 and Q06 is turned off. The current flowing through transistor Q01 flows into the base of transistor Q07, and turns it on. Then, if the value of load resistor RL is set to an adequate level, the voltage value of output signal Vout is set at substantially the ground level, i.e., at "L" level.

When the value of input signal V1 is lower than that of input signal V2, transistor Q04 is rendered more conductive than transistor Q03, and hence transistor Q02 is turned on and transistor Q01 is turned off. Accordingly, since a current flows through transistor Q06, the same amount of current flowing through transistor Q06 flows through transistor Q05. As a result, transistor Q05 prevents the current from flowing through the base of transistor Q07, resulting in transistor Q07 being turned off. Thus, output voltage Vout is pulled up by load resistor RL, and reaches a value substantially equivalent to that of power source Vcc, i.e., "H" level.

When input signal V1 or V2 is 0 (V), transistors Q05 and Q06, serving as an active load, can be operated normally, since the input stages of input signals V1 and V2 are constituted by the darlington-connected transistors. The lower limit of the voltage range of the input signals within which the comparison circuit can be operated normally is $-Vf$. In this case, reference symbol Vf denotes a voltage across the base and emitter of each of transistors Q01 to Q04 when they are rendered conductive.

When the minimum voltage across constant-current source A, required for its operation, is Vmin, and input signals V1 and V2 are both higher than (Vcc−Vmin−2Vf), the voltage between the terminals of constant-current source A drops to lower than Vmin, and hence constant-current source A cannot be operated normally. Consequently, the comparison circuit cannot be operated normally. More specifically, upper limit V0 of the input signals within which the comparison circuit can be operated normally is given as:

$$V0 = Vcc - Vmin - 2Vf$$

When one of the input signals is lower than (Vcc−Vmin−2Vf), the upper limit of the other signal is Vcc. When the input stage of the comparison circuit is constituted by the darlington-connected transistors, in this manner, the lower limit of the input signals can be lowered to $-Vf$, but the upper limit is restricted to (Vcc−Vmin−2Vf).

SUMMARY OF THE INVENTION

It is an object of the present invention to provide a comparison circuit which provides a sufficiently wide range of input signals to be normally compared.

In order to achieve the object of the present invention, there is provided a comparison circuit comprising first and second signal input terminals; differential amplifying means constituted by first and second input circuits each of which is connected to said first and second signal input terminals, and each of which has darlington-connected bipolar transistors; and operation mode control means for selectively short-circuiting the base-emitter path of each of said first stage bipolar transistors in said first and second input circuits, in response to the first and second input signals.

In the present invention, since the base-emitter path of each of the first stage transistors of the darlington-connected transistors is electrically disconnected and connected by an operation mode control circuit, so as to set a comparison operation mode appropriate for the level of an input signal, input signals of a wide range of levels can be compared.

BRIEF DESCRIPTION OF THE DRAWINGS

FIG. 2 is a circuit diagram of a comparison circuit which incorporates an operation mode-setting circuit according to an embodiment of the present invention;

FIG. 3 is a circuit diagram of a differential amplifier used in the operation mode-setting circuit shown in FIG. 2;

FIG. 4 is an equivalent circuit diagram of the comparison circuit shown in FIG. 2, when both input signals are higher than a predetermined level.

DETAILED DESCRIPTION OF THE PREFERRED EMBODIMENTS

Figure 1:
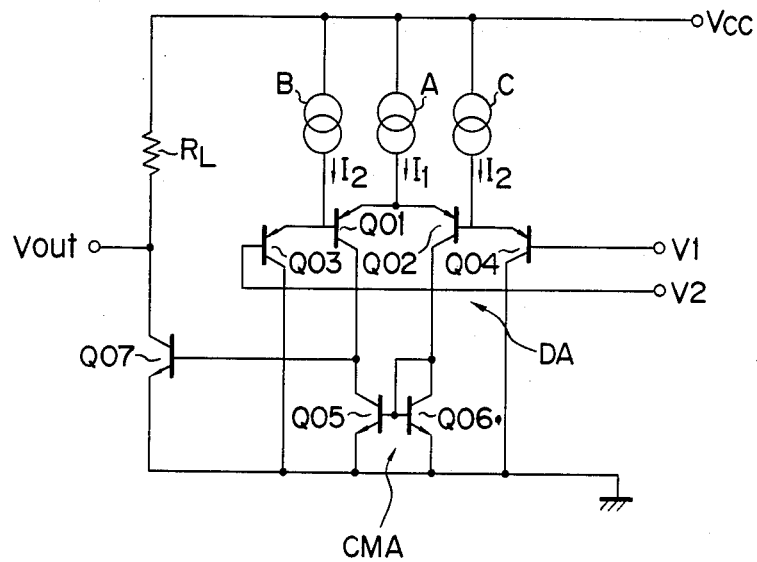
FIG. 1 is a circuit diagram of a conventional comparison circuit which includes a differential amplifier constituted by darlington-connected bipolar transistors.

FIG. 2 shows a circuit arrangement of a comparison circuit according to an embodiment of the present invention. Differential amplifier DA of the comparison circuit is constituted by darlington-connected pnp transistors Q1 and Q3, and darlington-connected pnp transistors Q2 and Q4. Constant-current source A is located between the emitters of transistors Q1 and Q2, and power source terminal Vcc. Constant current I1 is supplied by constant-current source A to differential amplifier DA.

The collectors of transistors Q1 and Q2 are grounded via npn transistors Q5 and Q6, which constitute current mirror circuit CM1.

First and second input signals V1 and V2 are respectively supplied to the bases of transistors Q4 and Q3. The collectors of transistors Q3 and Q4 are grounded.

The two collectors of multi-collector type pnp transistor Q10 are connected, one each, to the bases of transistors Q1 and Q2. The base of transistor Q10 is connected to the base of transistor Q11. Current mirror circuit CM2 is constituted by transistors Q10 and Q11. The emitters of transistors Q10 and Q11 are connected to power source terminal Vcc, and the collector and base of transistor Q11 are connected to each other.

The collector of transistor Q11 is grounded via npn transistor Q12. The base of transistor Q12 is connected to the base of npn transistor Q13. The base and collector of transistor Q13 are connected to each other. Transistors Q12 and Q13 constitute current mirror circuit CM3. The collector of transistor Q13 is connected to power source terminal Vcc via constant-current source CB.

First input signal V1 is supplied to the base of transistor Q4 and the inverting input terminal of first differential amplifier D1. Second input signal V2 is supplied to the base of transistor Q3 and the inverting input terminal of second differential amplifier D2. Reference voltage signal Vref is set at a predetermined value within the range, from voltage Vf, which is generated between the base and emitter of each of transistors Q1 to Q4 when they are rendered conductive, to a voltage given as $(Vcc-Vmin-2Vf)$. Reference voltage signal Vref is supplied to the non-inverting input terminals of first and second differential amplifiers D1 and D2. The outputs of first and second differential amplifiers D1 and D2 are connected to the inputs of NOR gate E. An output from NOR gate E is supplied to the base of npn transistor Q14 via resistor Rb. Constant current $(2 \times I2)$ from constant-current source CB is supplied to the collector of transistor Q14, and the emitter thereof is grounded.

The output terminal of NOR gate E is connected to inverter F and the gates of n-channel MOS transistors Q20 and Q21. An output from inverter F is supplied to the gates of p-channel MOS transistors Q22 and Q23.

N-channel MOS transistor Q20 and p-channel MOS transistor Q22 are connected in parallel with each other. First transmission gate G1 is constituted by transistors Q20 and Q22. One terminal of first transmission gate G1 of a CMOS type is connected to the base of transistor Q4, and the other terminal thereof is connected to the base of transistor Q2. Similarly, n-channel MOS transistor Q21 and p-channel MOS transistor Q23 are connected in parallel with each other. Second transmission gate G2 of a CMOS type is constituted by transistors Q21 and Q23. One terminal of second transmission gate G2 is connected to the base of transistor Q3, and the other terminal thereof is connected to the base of transistor Q1.

The collector of npn transistor Q5, which together with npn transistor Q6 constitutes current mirror circuit CM1, is connected to the base of transistor Q7. The emitter of transistor Q7 is grounded, and its collector is connected to power source terminal Vcc via resistor RL. Output signal Vout is extracted from the node between resistor RL and transistor Q7.

Each of first and second differential amplifiers D1 and D2 is constituted by, for example, pnp transistors Q101 and Q102, as shown in FIG. 3. The emitters of transistors Q101 and Q102 are connected to each other and are also connected to power source terminal Vcc via constant-current source K. Constant current I10 from constant-current source K is supplied to the emitters of transistors Q101 and Q102.

A combination of npn transistors Q103 and Q104 constitutes current mirror CM4. Transistors Q103 and Q104 serve as active loads of the differential amplifier section constituted by transistors Q101 and Q102. The collector of transistor Q104 is connected to power source terminal Vcc via resistor Rd, and its emitter is grounded. Output signal Vout of each of differential amplifiers D1 and D2 is extracted from the node between resistor Rd and transistor Q104.

The base of transistor Q101 serves as the inverting input terminal of differential amplifier D1 or D2, and first or second input signal V1 or V2 is supplied thereto. The base of transistor Q102 serves as the non-inverting input terminal of this differential amplifier, and reference voltage Vref, i.e., a voltage value set between Vf and $(Vcc-Vmin-2Vf)$ is supplied thereto.

The operation of the comparison circuit with the arrangement shown in FIG. 2 will now be described in detail.

When the voltage values of input signals V1 and V2 are both lower than reference voltage Vref, the output voltages of first and second differential amplifiers D1 and D2 are both set at "H" level, and hence the output voltage from NOR gate E is set at "L" level. As a result, transistor Q14 is turned off, and current I2 is supplied to the emitters of transistors Q3 and Q4, respectively, by current mirror circuit CM2 constituted by transistors Q10 and Q11, and constant-current source CB. Since transmission gates G1 and G2 of a CMOS type, constituted by transistors Q20 and Q22 and transistors Q21 and Q23, respectively, are both turned off, the base and emitter of each of transistors Q4 and Q3 are electrically isolated from each other. More specifically, in this case, the comparison circuit shown in FIG. 2 operates as one comprising the darlington-connected differential transistor pair as described with reference to FIG. 1.

When the voltage value of input signal V1 is higher than that of reference signal Vref, and that of input signal V2 is lower than that of reference signal Vref, the outputs from differential amplifiers D1 and D2 are respectively set at "L" and "H" levels. As a result, the output from NOR gate E is set at "L" level, and thus, the comparison circuit shown in FIG. 2 similarly operates as one comprising a differential transistor pair having darlington-connected transistors at the input stage.

When the voltage value of input signal V1 is lower than that of reference signal Vref, and that of input signal V2 is higher than that of reference signal Vref, the outputs from differential amplifiers D1 and D2 are respectively set at "H" and "L" levels. As a result, the output from NOR gate E is set at "L" level, and hence in this case, the comparison circuit shown in FIG. 2 similarly operates as one comprising a darlington-connected differential transistor pair.

When the voltage values of input signals V1 and V2 are both larger than that of reference voltage signal Vref, the outputs from differential amplifiers D1 and D2 are both set at "L" level. As a result, the output from NOR gate E is set at "H" level, and first transmission gate G1 constituted by transistors Q20 and Q22, and second transmission gate G2 constituted by transistors Q21 and Q23 are respectively turned on. Since transistor Q14 is turned on, current mirror circuit CM2 constituted by transistors Q10 and Q11, and constant current source CB are rendered inoperative. Therefore, the comparison circuit shown in FIG. 2 operates as one comprising a single differential transistor pair as shown in FIG. 4.

Resistor Ron connected to the base of each of transistors Q1 and Q2 in FIG. 4 is equivalent to the ON resistances of first and second transmission gates G1 and G2 shown in FIG. 2. Since upper limit Vo, below which the comparison circuit comprising such a single differential transistor pair can operate, is given as (Vcc−Vmin−Vf), the operation range of input signals is widened by Vf as compared with the conventional comparison circuit.

More specifically, when at least one of input signals V1 and V2 is lower than the voltage value of reference voltage signal Vref, the comparison circuit shown in FIG. 2 operates as one comprising a darlington-connected differential transistor pair. When input signals V1 and V2 are both higher than the voltage value of reference voltage signal Vref, the comparison circuit then operates as one comprising a single differential transistor pair.

Therefore, the range of input signals within which the comparator can operate is from −Vf to (Vcc−Vmin−Vf).

Transistors Q1 and Q2 are formed so as to be identical in shape and size with transistors Q3 and Q4, in order to substantially eliminate the difference in the offset of output voltages upon switching between the two comparison operation modes. In one of these modes, the darlington-connected differential transistor pair is rendered operative, while in the other mode, only a single differential transistor pair is rendered operative.

A comparison circuit according to another embodiment of the present invention will now be described, with reference to FIG. 5.

In a comparison circuit used in, for example, an A/D converter of a successive approximating type, the state of an input signal can be predicted. More specifically, an analog input signal is supplied to one input of the comparison circuit, and a digital signal, which is decreased stepwisely to approximate the analog input from the most significant bit (MSB), is supplied to the other input thereof. In such a case, the analog input signal can determine whether the comparison circuit operates as one having a darlington-connected differential transistor pair or one having a single differential transistor pair.

Figure 5:
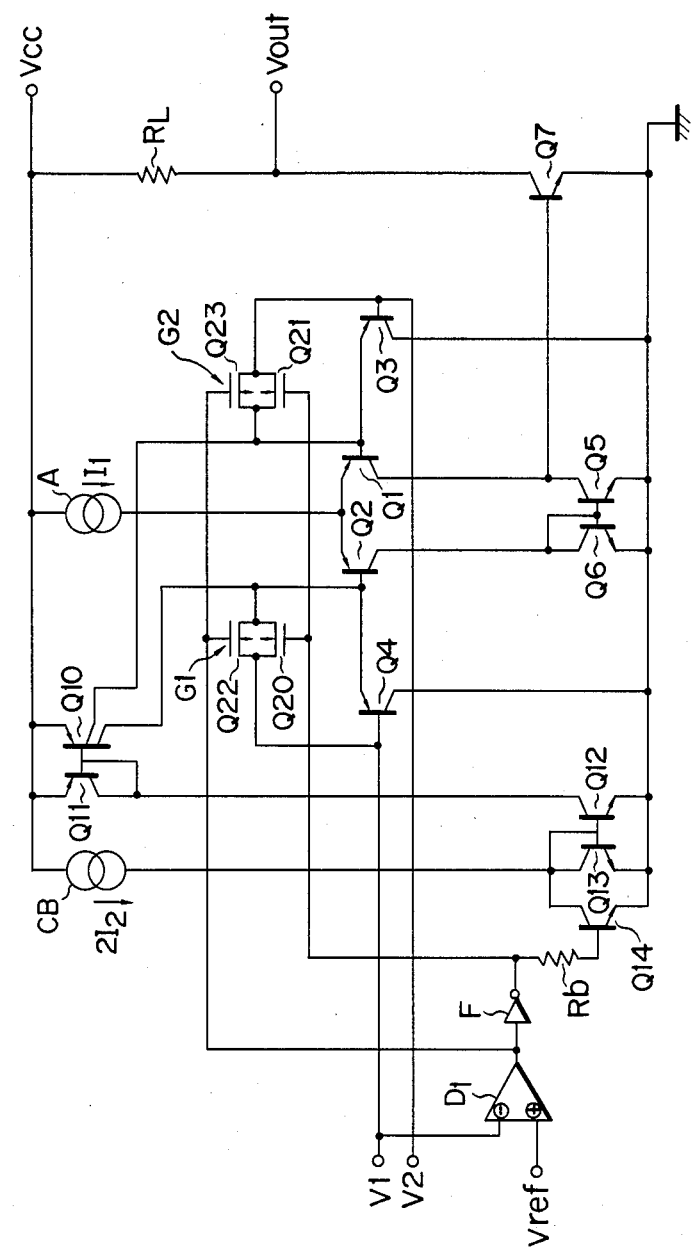
FIG. 5 is a circuit diagram of a comparison circuit according to another embodiment of the present invention.

FIG. 5 shows an example of the circuit arrangement of this embodiment. The reference numerals as in FIG. 2 denote the same parts in FIG. 5.

In FIG. 5, first input signal V1, corresponding to the analog input signal, is supplied to the inverting input terminal of differential amplifier D1, the base of transistor Q4, and one terminal of first transmission gate G1 constituted by transistors Q20 and Q22. Second input signal V2, corresponding to the digital signal, is supplied to the base of transistor Q3 and one terminal of second transmission gate G2 constituted by transistors Q21 and Q23. An output from differential amplifier D1 is supplied to the gate of each of transistors Q22 and Q23 and inverter F. An output from inverter F is supplied to the gate of each of transistors Q20 and Q21 and to the base of transistor Q14 via resistor Rb. More specifically, when the value of first input signal V1, corresponding to the analog input, is higher than the voltage value of reference voltage signal Vref, the comparison circuit operates as one comprising a single differential transistor pair. When the value of input signal V1 is lower than the voltage value of reference voltage signal Vref, it then operates as a comparison circuit comprising a darlington-connected differential transistor pair.

Note that npn and pnp transistors can be used in place of the pnp and npn transistors in the above embodiments. Although transmission gates of a CMOS type are used for insulating or short-circuiting the base-emitter path of each of darlington-connected first stage transistors Q3 and Q4, analog switches constituted by p- or n-channel MOS transistors can be used instead.

Furthermore, AND gates can be used in place of differential amplifiers D1 and D2 and NOR gate E used in the comparison circuit shown in FIG. 2. In this case, the threshold value for input signals V1 and V2 input to the AND gates must be set at the voltage value of reference voltage signal Vref.

As has been described above, according to the present invention, a switching means is arranged between the base and emitter of each of the darlington-connected first stage transistors, and a switching control means is also provided to control the conductive state of the switching means on the basis of the level of an input signal. Therefore, on the basis of the level of the input signal, the comparison circuit can be operated as a differential transistor pair constituted by darlington-connected transistors or as a single differential transistor pair.

Furthermore, the input signal range within which the comparison circuit can operate normally can be widened.

What is claimed is:
1. A comparison circuit comprising:
first and second signal input terminals having applied thereto first and second input signals, respectively;
differential amplifying means including first and second input circuits, said input circuits being connected to said first and second signal input terminals, respectively, each of said input circuits having first and second bipolar transistors connected in a darlington configuration; and
operation mode control means for selectively short-circuiting the base-emitter path of said first bipolar transistor located in said first and second input circuits in response to the first and second input signals.

2. A circuit according to claim 1, wherein said operation mode control circuit comprises first and second switching means, each of which is connected between the base and emitter of each of said bipolar transistors in said first and second input circuits, and switch control means for selectively rendering said first and second switching means conductive, in response to the input signals supplied to said first and second signal input terminals.

3. A circuit according to claim 2, wherein each of said first and second switching means is arranged as a CMOS type transmission gate.

4. A circuit according to claim 3, wherein said switch control means comprises a level-detecting circuit which renders said first and second switching means conductive upon detecting that an input signal exceeding a predetermined signal level is supplied to each of said first and second signal input terminals, and which renders said first and second switching means nonconductive upon detecting that at least one of the input signals is lower than said predetermined signal level.

5. A circuit according to claim 4, wherein said level-detecting circuit comprises first and second comparing means for comparing the input signals supplied to said first and second signal input terminals with said predetermined signal level, and a logic circuit for generating a switch-energizing signal in response to the output signals from said first and second comparing means, when both the input signals are higher than said predetermined level.

6. A circuit according to claim 4, wherein a signal which is reduced stepwisely from a level higher than said predetermined signal level is supplied to said first signal input terminal, and said level-detecting circuit comprises comparing means for comparing the input signal supplied to said second signal input terminal with said predetermined signal level, so as to supply the switch-energizing signal to said switching means when the input signal is higher than said predetermined level.

7. A circuit according to claim 2, wherein said switch control means comprises a level-detecting circuit which renders said first and second switching means conductive upon detecting that an input signal exceeding a predetermined signal level is supplied to each of said first and second signal input terminals, and which renders said first and second switching means nonconductive upon detecting that at least one of the input signals is lower than said predetermined signal level.

8. A circuit according to claim 7, wherein said level-detecting circuit comprises first and second comparing means for comparing the input signals supplied to said first and second signal input terminals with said predetermined signal level, and a logic circuit for generating a switch-energizing signal in response to the output signals from said first and second comparing means, when both the input signals are higher than said predetermined level.

9. A circuit according to claim 7, wherein a signal which is reduced stepwisely from a level higher than said predetermined signal level is supplied to said first signal input terminal, and said level-detecting circuit comprises comparing means for comparing the input signal supplied to said second signal input terminal with said predetermined signal level, so as to supply the switch-energizing signal to said switching means when the input signal is higher than said predetermined level.

10. A circuit according to claim 2, wherein said first and second switching means are respectively constituted by MOS transistors.

11. A circuit according to claim 10, wherein said switch control means comprises a level-detecting circuit which renders said first and second switching means conductive upon detecting that an input signal exceeding a predetermined signal level is supplied to each of said first and second signal input terminals, and which renders said first and second switching means nonconductive upon detecting that at least one of the input signals is lower than said predetermined signal level.

* * * * *